(12) United States Patent
Hong

(10) Patent No.: US 11,503,702 B2
(45) Date of Patent: Nov. 15, 2022

(54) ELECTRONIC DEVICE COMPRISING CONDUCTIVE MEMBER DISPOSED TO HAVE DIELECTRIC-FILLABLE INTERVAL SPACE ALONG WIRE

(71) Applicant: SAMSUNG ELECTRONICS CO., LTD., Suwon-si (KR)

(72) Inventor: Eunseok Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/286,160

(22) PCT Filed: Oct. 18, 2019

(86) PCT No.: PCT/KR2019/013782
§ 371 (c)(1),
(2) Date: Apr. 16, 2021

(87) PCT Pub. No.: WO2020/080902
PCT Pub. Date: Apr. 23, 2020

(65) Prior Publication Data
US 2021/0392739 A1 Dec. 16, 2021

(30) Foreign Application Priority Data

Oct. 19, 2018 (KR) ........................ 10-2018-0125359

(51) Int. Cl.
*H05K 1/02* (2006.01)
*H01P 3/08* (2006.01)
(Continued)

(52) U.S. Cl.
CPC ........... *H05K 1/0219* (2013.01); *H01P 3/081* (2013.01); *H05K 1/0298* (2013.01); *H05K 1/144* (2013.01);
(Continued)

(58) Field of Classification Search
CPC .... H05K 1/0219; H05K 1/0298; H05K 1/144; H05K 9/0024; H05K 2201/042;
(Continued)

(56) References Cited

U.S. PATENT DOCUMENTS 4,801,905 A 1/1989 Becker
5,436,405 A 7/1995 Hogge, Jr. et al.
(Continued)

FOREIGN PATENT DOCUMENTS

CN 106772835 5/2017
JP 5050797 10/2012
(Continued)

OTHER PUBLICATIONS

English Translation JP2017135749 (Year: 2017).*
(Continued)

*Primary Examiner* — Steven T Sawyer
(74) *Attorney, Agent, or Firm* — Nixon & Vanderhye, P.C.

(57) ABSTRACT

An electronic device according to various embodiments of the present invention may comprise: a circuit substrate comprising a first layer including a first wire, a second wire formed at one side surface of the first wire along the first wire, and a third wire formed at the other side surface of the first wire along the first wire, a second layer including a ground plane formed along the first wire, the second wire, and the third wire and electrically connected to the second wire and the third wire, and an insulation layer disposed between the first layer and the second layer and having first permittivity; and a conductive member which is disposed above the first layer to have a dielectric-fillable interval space along the first wire and is electrically connected to the ground of the electronic device, the dielectric having second permittivity lower than the first permittivity.

10 Claims, 15 Drawing Sheets

(51) Int. Cl.
*H05K 1/14* (2006.01)
*H05K 9/00* (2006.01)

(52) U.S. Cl.
CPC ..... *H05K 9/0024* (2013.01); *H05K 2201/042* (2013.01)

(58) Field of Classification Search
CPC ......... H05K 1/0218; H05K 2201/0723; H05K 2201/0707; H01P 3/081; H01P 3/006; H01P 3/16; H04M 1/0277; H04M 1/026
See application file for complete search history.

(56) References Cited

U.S. PATENT DOCUMENTS

| | | | |
|---|---|---|---|
| 5,596,804 A | 1/1997 | Hogge, Jr. et al. | |
| 6,356,173 B1* | 3/2002 | Nagata | H01L 23/66 333/260 |
| 7,209,087 B2 | 4/2007 | Tang et al. | |
| 8,324,979 B2 | 12/2012 | Cho | |
| 9,179,538 B2 | 11/2015 | Foster et al. | |
| 2003/0179055 A1 | 9/2003 | Sweeney et al. | |
| 2003/0220129 A1* | 11/2003 | Pan | H04B 15/02 455/90.3 |
| 2010/0046190 A1* | 2/2010 | Tsunemasu | H05K 9/0026 361/816 |
| 2010/0214041 A1 | 8/2010 | Cho | |
| 2011/0026234 A1* | 2/2011 | Kim | H05K 1/0236 361/818 |
| 2012/0320558 A1* | 12/2012 | Foster | H05K 9/0026 29/841 |
| 2013/0089992 A1* | 4/2013 | Yang | H05K 9/0035 439/75 |
| 2014/0168908 A1* | 6/2014 | Chuang | H05K 1/0218 361/735 |
| 2015/0049439 A1* | 2/2015 | Shimamura | H01L 23/3135 361/728 |
| 2018/0204783 A1* | 7/2018 | Han | H05K 9/0088 |

FOREIGN PATENT DOCUMENTS

| | | |
|---|---|---|
| JP | 2016-213348 | 12/2016 |
| JP | 2017-135749 | 8/2017 |
| KR | 10-2014-0023381 | 2/2014 |

OTHER PUBLICATIONS

International Search Report for PCT/KR2019/013782, dated Feb. 20, 2020, 4 pages.
Written Opinion of the ISA for PCT/KR2019/013782, dated Feb. 20, 2020, 5 pages.
Extended Search Report dated Nov. 3, 2021 in counterpart European Application No. 19874183.7.

* cited by examiner

ELECTRONIC DEVICE COMPRISING CONDUCTIVE MEMBER DISPOSED TO HAVE DIELECTRIC-FILLABLE INTERVAL SPACE ALONG WIRE

This application is the U.S. national phase of International Application No. PCT/KR2019/013782 filed 18 Oct. 2019, which designated the U.S. and claims priority to KR Patent Application No. 10-2018-0125359 filed 19 Oct. 2018, the entire contents of each of which are hereby incorporated by reference.

FIELD

Various embodiments of the disclosure relate to an electronic device including a micro-strip line.

DESCRIPTION OF RELATED ART

Recently, due to a rapid increase in network traffic caused by mobile devices, a next-generation mobile communication technology using a signal in an ultra-high frequency band, for example, fifth-generation (5G) mobile communication technology has been developed. When a signal in the ultra-high frequency band is used, the wavelength of the signal may be shortened in millimeters, and the bandwidth may be used more widely. Accordingly, a larger amount of information may be transmitted or received. A signal in the ultra-high frequency band may be referred to as a so-called millimeter wave signal. Furthermore, an antenna array has higher effective isotropically radiated power (EIRP) than one antenna, and thus fifth-generation (5G) mobile communication to which an antenna array is applied may more efficiently transmit/receive various types of data.

SUMMARY

In an existing fourth-generation mobile communication (e.g., LTE) environment, a coaxial cable or a strip-line/micro-strip line using a PCB/FPCB is used as a signal line for processing an RF signal.

In a case of processing an RF signal using a coaxial cable in a fifth-generation (5G) mobile communication environment, as the frequency (e.g., about 28 Ghz to about 39 Ghz) of the RF signal is raised, it may be difficult to transmit the signal at a performance level equivalent to that of a PCB/FPCB type line. Furthermore, the coaxial cable is relatively expensive and requires a relatively large amount of mounting space in an electronic device.

In a case of processing an RF signal through a strip-line in a fifth-generation (5G) mobile communication environment, the strip-line may be advantageous for isolation because an upper end and a lower end of a signal line are surrounded by a ground shielding structure. However, the strip-line may have a greater line loss than a micro-strip line.

In a case of processing an RF signal through a micro-strip line in a fifth-generation (5G) mobile communication environment, the micro-strip line may have a smaller line loss than a strip-line. However, the micro-strip line may be disadvantageous for isolation because one surface thereof is open to air.

Embodiments of the disclosure may provide an electronic device including a micro-strip line protected by a shielding structure.

An electronic device according to various embodiments of the disclosure includes a circuit board and a conductive member. The circuit board includes a first layer including a first wire, a second wire formed on one side of the first wire along the first wire, and a third wire formed on an opposite side of the first wire along the first wire, a second layer that is formed along the first wire, the second wire, and the third wire and that includes a ground plane electrically connected with the second wire and the third wire, and an insulating layer that is disposed between the first layer and the second layer and that has a first permittivity. The conductive member is disposed on the first layer so as to have, along the first wire, a separation space that is able to be filled with a dielectric having a second permittivity lower than the first permittivity, the conductive member being electrically connected with a ground of the electronic device.

The electronic device according to the various embodiments of the disclosure may include a micro-strip line covered by a shielding structure.

The electronic device according to the various embodiments of the disclosure may form the shielding structure using a conductive member around the micro-strip line.

The electronic device according to the various embodiments of the disclosure, when transmitting a high-frequency RF signal, such as a 5G signal, through the shielding structure, may suppress occurrence of parasitic resonance between the shielding structure and surrounding elements and may reduce a transmission loss of the RF signal.

DETAILED DESCRIPTION OF EXAMPLE EMBODIMENTS

Figure 1:
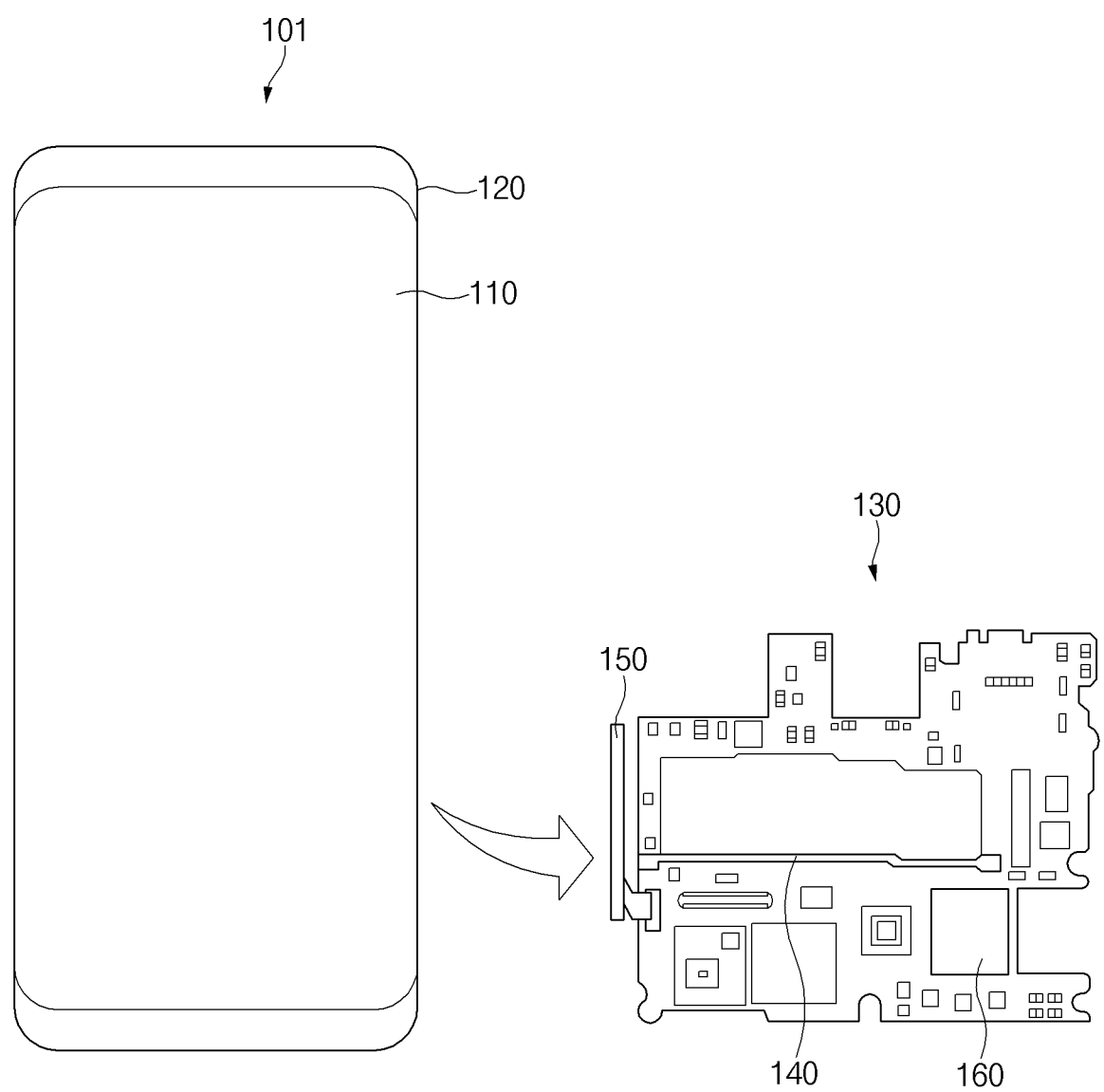
FIG. 1 illustrates an electronic device according to various embodiments.

Hereinafter, various embodiments of the present disclosure will be described with reference to the accompanying drawings. Accordingly, those of ordinary skill in the art will recognize that modification, equivalent, and/or alternative on the various embodiments described herein can be variously made without departing from the scope and spirit of the present disclosure. With regard to description of drawings, similar components may be marked by similar reference numerals.

In the disclosure disclosed herein, the expressions "have", "may have", "include" and "comprise", or "may include" and "may comprise" used herein indicate existence of corresponding features (for example, elements such as numeric values, functions, operations, or components) but do not exclude presence of additional features.

In the disclosure disclosed herein, the expressions "A or B", "at least one of A or/and B", or "one or more of A or/and B", and the like used herein may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used herein may refer to various elements of various embodiments of the present disclosure, but do not limit the elements. For example, such terms are used only to distinguish an element from another element and do not limit the order and/or priority of the elements. For example, a first user device and a second user device may represent different user devices irrespective of sequence or importance. For example, without departing the scope of the present disclosure, a first element may be referred to as a second element, and similarly, a second element may be referred to as a first element.

It will be understood that when an element (for example, a first element) is referred to as being "(operatively or communicatively) coupled with/to" or "connected to" another element (for example, a second element), it can be directly coupled with/to or connected to the other element or an intervening element (for example, a third element) may be present. In contrast, when an element (for example, a first element) is referred to as being "directly coupled with/to" or "directly connected to" another element (for example, a second element), it should be understood that there are no intervening element (for example, a third element).

According to the situation, the expression "configured to" used herein may be used as, for example, the expression "suitable for", "having the capacity to", "designed to", "adapted to", "made to", or "capable of". The term "configured to (or set to)" must not mean only "specifically designed to" in hardware. Instead, the expression "a device configured to" may mean that the device is "capable of" operating together with another device or other components. CPU, for example, a "processor configured to (or set to) perform A, B, and C" may mean a dedicated processor (for example, an embedded processor) for performing a corresponding operation or a generic-purpose processor (for example, a central processing unit (CPU) or an application processor) which may perform corresponding operations by executing one or more software programs which are stored in a memory device.

Terms used in this specification are used to describe specified embodiments of the present disclosure and are not intended to limit the scope of the present disclosure. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal detect unless expressly so defined herein in various embodiments of the present disclosure. In some cases, even if terms are terms which are defined in the specification, they may not be interpreted to exclude embodiments of the present disclosure.

An electronic device according to various embodiments of the present disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), MP3 players, mobile medical devices, cameras, and wearable devices. According to various embodiments of the present disclosure, the wearable devices may include accessories (for example, watches, rings, bracelets, ankle bracelets, glasses, contact lenses, or head-mounted devices (HMDs)), cloth-integrated types (for example, electronic clothes), body-attached types (for example, skin pads or tattoos), or implantable types (for example, implantable circuits).

Hereinafter, electronic devices according to an embodiment of the present disclosure will be described with reference to the accompanying drawings. The term "user" used herein may refer to a person who uses an electronic device or may refer to a device (for example, an artificial electronic device) that uses an electronic device.

FIG. 1 illustrates an electronic device according to various embodiments.

Referring to FIG. 1, the electronic device 101 may include a display (or, a display module) 110 and a main body (or, a housing or a frame) 120.

The display 110 may include, for example, a liquid crystal display (LCD), a light emitting diode (LED) display, an organic light emitting diodes (OLED) display, a microelectromechanical systems (MEMS) display, or electronic paper. The display 110 may, for example, display various types of contents (e.g., text, images, videos, icons, and/or symbols) to a user.

The main body 120 may have the display 110 mounted thereon. The main body 120 may allow an active area of the display 110 to be disposed toward a first surface (a front surface). The main body 120 may contain various components (e.g., a processor, a memory, communication circuitry, a battery, a circuit board, or the like) for driving the electronic device 101.

According to various embodiments, the main body 120 may contain a circuit board 130 on which various elements are mounted. Furthermore, the main body 120 may contain various signal lines (or, wires) for electrical connection between elements.

For example, the main body 120 may contain a signal line 140 for transmission of an RF signal. The signal line 140 may transmit an RF signal received from an antenna 150 to an RF module (or, an RF chip) 160 mounted on the circuit board 130. The signal line 140 may transmit a signal generated by the RF module (or, the RF chip) 160 to the antenna 150.

According to various embodiments, the signal line 140 may be implemented with a micro-strip line having a shielding structure. In general, a micro-strip line may be disadvantageous for isolation because one surface thereof is open to air. However, the micro-strip line may have a smaller line loss than a strip line. The signal line 140 may improve signal transmission efficiency by electrically or spatially separating a surrounding part and a central wire through a separate shielding structure.

Although FIG. 1 illustrates an example that the signal line 140 is formed on the one circuit board 130, the disclosure is not limited thereto. For example, the signal line 140 may be used to connect a first PCB and a second PCB.

Figure 2:
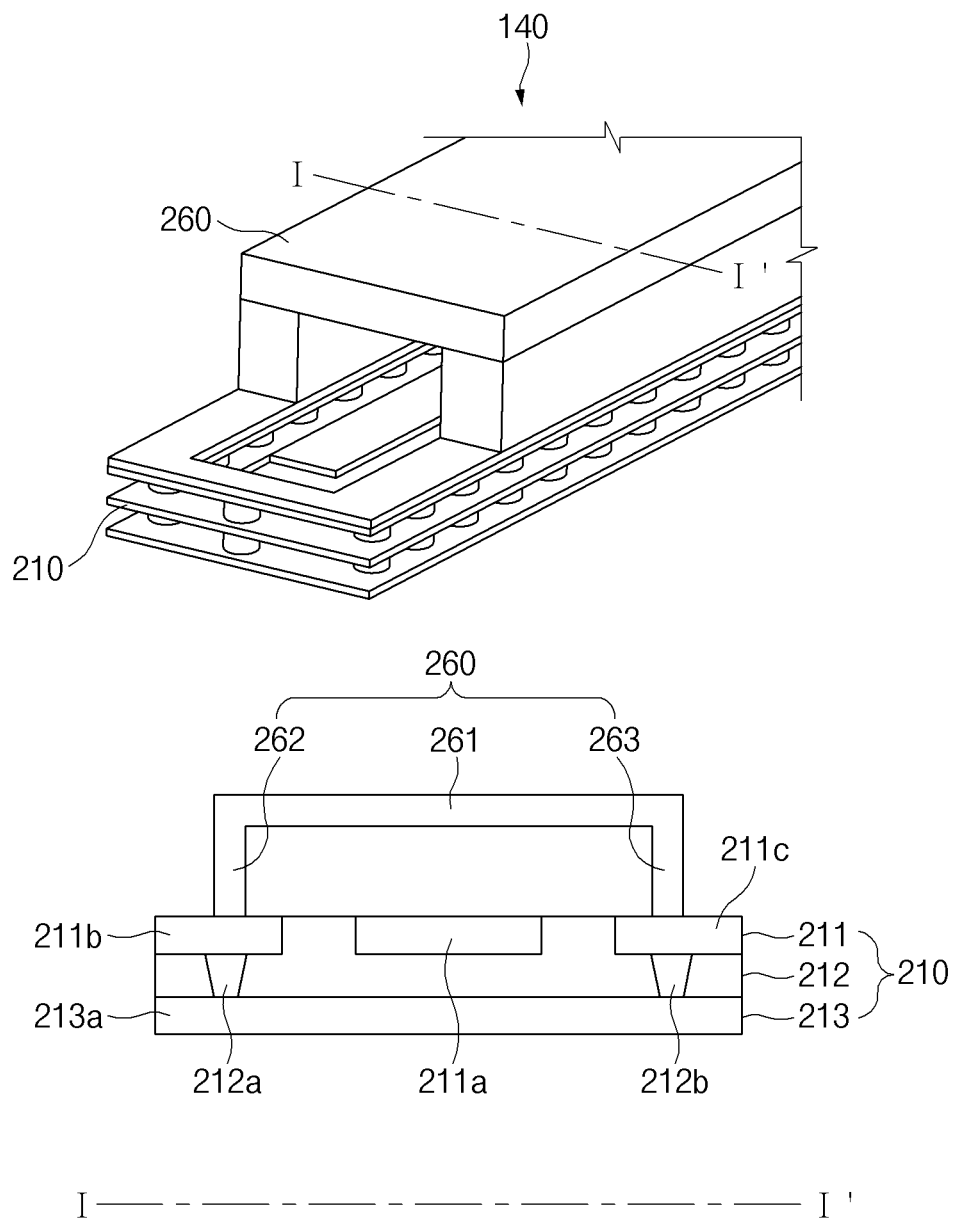
FIG. 2 illustrates a micro-strip line having a shielding structure according to various embodiments.

FIG. 2 illustrates a micro-strip line having a shielding structure according to various embodiments.

Referring to FIG. 2, the signal line 140 may include the micro-strip line 210 and the shielding structure 260 surrounding one surface of the micro-strip line 210. The micro-strip line 210 may be surrounded by the shielding structure 260. According to an embodiment, the micro-strip line 210 may be part of a circuit board (e.g., a PCB or an FPCB).

In a sectional view taken along line I-I', the micro-strip line 210 may include a plurality of layers. For example, the micro-strip line 210 may include a first layer 211, an insulating layer 212, and a second layer 213.

According to an embodiment, the first layer 211 may include a central wire 211a, a first auxiliary wire 211b, and a second auxiliary wire 211c. The central wire 211a may transmit signals between elements in the interior of the electronic device 101 through the micro-strip line 210. For example, the signals may be RF signals received through an antenna (e.g., 5G or 4G).

According to an embodiment, the first auxiliary wire 211b may be spaced apart from a first side surface of the central wire 211a by a specified distance. The first auxiliary wire 211b may be formed of a conductive material (e.g., metal). In an embodiment, the first auxiliary wire 211b may be formed of the same material as that of the central wire 211a or the second auxiliary wire 211c.

According to an embodiment, the first auxiliary wire 211b may be connected to a ground panel 213a of the third layer 213 through a first connecting member 212a. The first auxiliary wire 211b may stabilize signals transmitted through the central wire 211a.

According to an embodiment, the first auxiliary wire 211b may be connected to a first sidewall 262 of the shielding structure 260. The first auxiliary wire 211b may be electrically connected to the ground panel 213a of the second layer 213 through the first connecting member 212a in the interior of the circuit board 210.

According to an embodiment, the second auxiliary wire 211c may be space apart from a second side surface of the central wire 211a by a specified distance. The second auxiliary wire 211c may be formed of a conductive material (e.g., metal). In an embodiment, the second auxiliary wire 211c may be formed of the same material as that of the central wire 211a or the first auxiliary wire 211b.

According to an embodiment, the second auxiliary wire 211c may be connected to the ground panel 213a of the third layer 213 through a second connecting member 212b. The second auxiliary wire 211c may stabilize signals transmitted through the central wire 211a.

According to an embodiment, the second auxiliary wire 211c may be connected to a second sidewall 263 of the shielding structure 260. The second auxiliary wire 211c may be electrically connected to the ground panel 213a of the second layer 213 through the second connecting member 212b.

According to an embodiment, the insulating layer 212 may be disposed between the first layer 211 and the second layer 213. Parts of the insulating layer 212 may extend into the first layer 211. For example, part of the insulating layer 212 may extend into a space between the central wire 211a and the first auxiliary wire 211b and may electrically isolate the central wire 211a and the first auxiliary wire 211b. Similarly, another part of the insulating layer 212 may extend into a space between the central wire 211a and the second auxiliary wire 211c and may electrically isolate the central wire 211a and the second auxiliary wire 211c. The insulating layer 212 may be implemented with a material (e.g., polyimide (PI)) that has insulation performance. The insulating layer 212 may have a first permittivity according to the material.

According to an embodiment, the insulating layer 212 may include the first connecting member (or, the first via) 212 and the second connecting member (the second via) 212b. The first connecting member 212a may be a conductor electrically connecting the first auxiliary wire 211b and the ground panel 213a of the second layer 213. The second connecting member 212b may be a conductor electrically connecting the second auxiliary wire 211c and the ground panel 213a of the second layer 213.

According to an embodiment, the second layer 213 may be separated from the first layer 211 by the insulating layer 212. The second layer 213 may be disposed on the opposite side to the shielding structure 260. The second layer 213 may include the ground panel 213a. The ground panel 213a may be connected to the first auxiliary wire 211b and the second auxiliary wire 211c through the first connecting member 212a and the second connecting member 212b.

According to an embodiment, the shielding structure (the conductive member) 260 may have a shape surrounding the central wire 211a. The shielding structure 260 may extend in a direction in which the central wire 211a extends. The shielding structure 260 may form, on a surface of the first layer 211, a space that is able to be filled with a dielectric (e.g., air) having a second permittivity different from the first permittivity of the insulating layer 212.

According to an embodiment, the shielding structure 260 may separate the central wire 211a from surrounding components, thereby reducing a signal loss and reducing occurrence of parasitic resonance. Although FIG. 2 illustrates an example that the shielding structure 260 has a quadrilateral shape, the disclosure is not limited thereto. The shielding structure 260 may have various shapes (e.g., a semicircular shape).

According to an embodiment, the shielding structure 260 may include an upper portion 261, the first sidewall 262, and the second sidewall 263. The upper portion 261 may extend in a direction parallel to the central wire 211a. The first sidewall 262 may connect the upper portion 261 and the first auxiliary wire 211b. The second sidewall 263 may connect the upper portion 261 and the second auxiliary wire 211c. The upper portion 261, the first sidewall 262, and the second sidewall 263 may be integrally formed of the same material.

According to an embodiment, the first sidewall 262 and the second sidewall 263 may be parallel to each other. The upper portion 261 may be perpendicular to the first sidewall 262 and the second sidewall 263.

Figure 3:
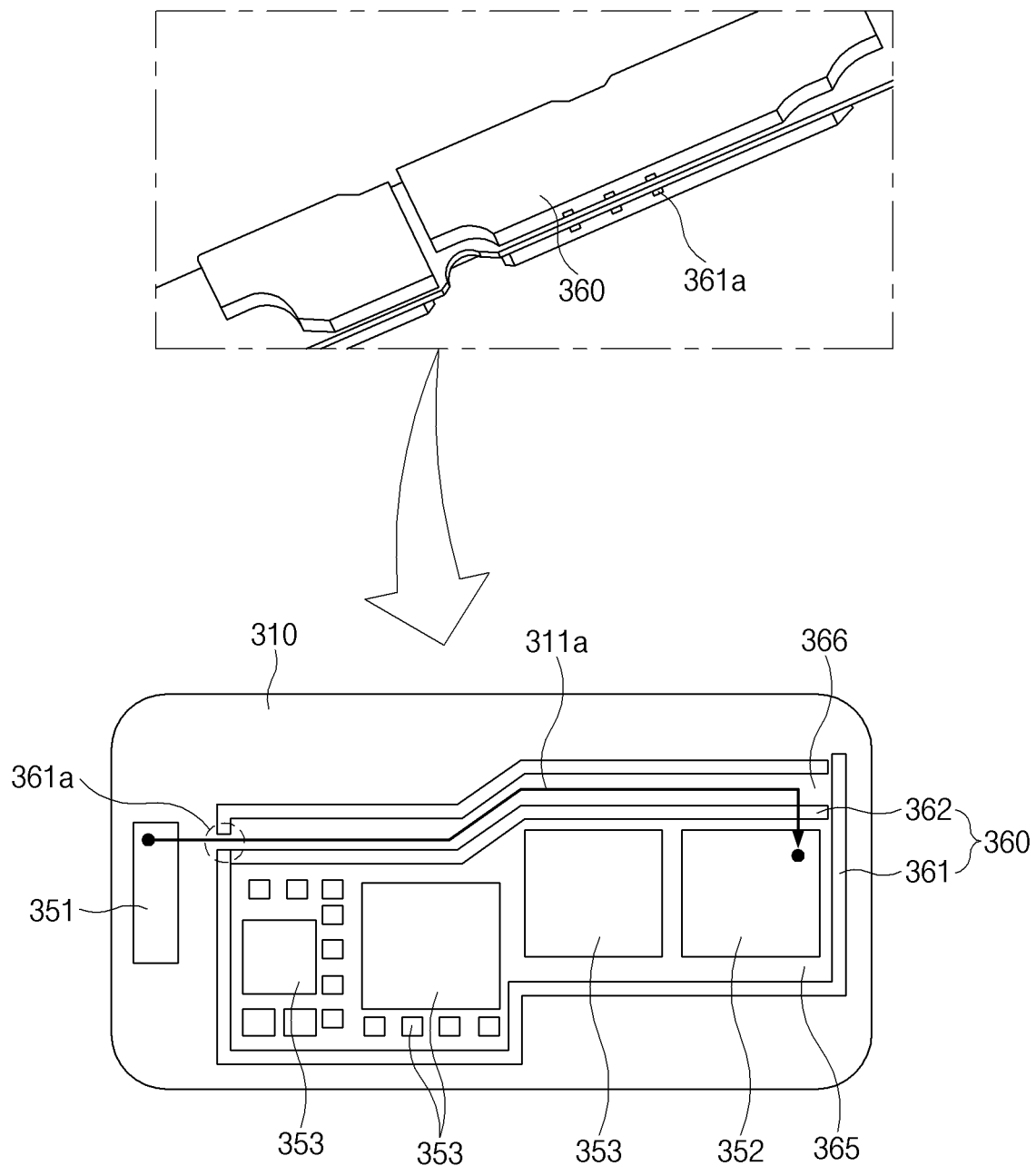
FIG. 3 illustrates a shielding structure integrally formed with a shield can for surrounding parts according to various embodiments.

FIG. 3 illustrates a shielding structure integrally formed with a shield can for surrounding parts according to various embodiments. Although the shielding structure integrally formed with the shield can for the surrounding parts is illustrated as an example in FIG. 3, the disclosure is not limited thereto. For example, the shielding structure may be formed separately from the shield can and may be disposed adjacent to the shield can.

Referring to FIG. 3, a circuit board (e.g., a PCB) 310 may have various elements 352 and 353 mounted thereon. For example, the circuit board 310 may have a processor (AP), a memory chip, a communication chip, and the like mounted thereon. At least some of the elements 352 and 353 mounted on the circuit board 310 may be covered by the shield can 360. The shield can 360 may separate the elements 352 and 353 therein from other elements outside the shield can 360 and may block a flow of heat or electromagnetic waves.

According to various embodiments, the shield can 360 may include an outer wall 361 and an inner wall 362. The shield can 360 may be divided into a first area 365 and a second area 366 by the inner wall 362. The first area 365 may be an area in which the elements 352 and 353 are mounted. The second area 332 may be an area in which a line for signal transmission is disposed.

A central line 311a (e.g., the central line 211a of FIG. 2) that forms part of a micro-strip line may be disposed in the second area 332. The central wire 311a may be disposed to maintain a specified distance from the inner wall 362.

According to an embodiment, the central wire 311a may electrically connect a first element 351 outside the shield can 360 and the second element 352 inside the shield can 360. For example, the central wire 311a may connect a 5G antenna outside the shield can 360 and an RF module (chip) inside the shield can 360 through a surface mount device (SMD) point of the circuit board 310. The central wire 311a may transmit an RF signal received through the 5G antenna to the RF module.

According to an embodiment, the outer wall 361 of the shield can 360 may include a slit 361a. The slit 361a may form a space through which the central wire 311a is connected with the first element 351 outside the shield can 360.

According to an embodiment, the inner wall 362 of the shield can 360 may include a separate slit formed therein. The separate slit may form a space through which the central wire 311a is connected with the second element 352 inside the shield can 360.

Figure 4:
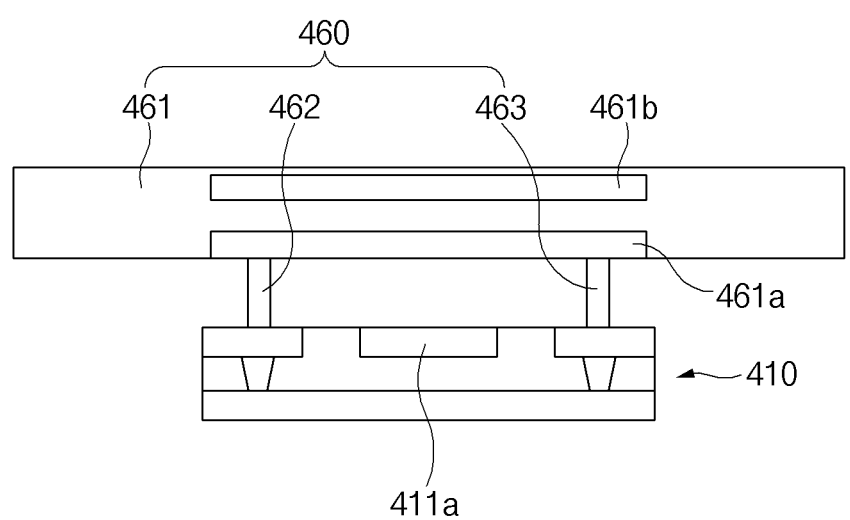
FIG. 4 is a sectional view illustrating a form in which part of a shielding structure is formed as part of a surrounding circuit board according to various embodiments.

FIG. 4 is a sectional view illustrating a form in which part of a shielding structure is formed as part of a surrounding circuit board according to various embodiments.

Referring to FIG. 4, a micro-strip line 410 may be surrounded by the shielding structure 460. For example, the shielding structure 460 may be part of a circuit board (e.g., a main PCB) that is disposed adjacent to the micro-strip line 410. The structure of the micro-strip line 410 may be the same as, or similar to, the structure of the micro-strip line 210 in FIG. 2.

The shielding structure 460 may include an upper structure 461, a first sidewall 462, and a second sidewall 463. The upper structure 461 may be part of the circuit board (e.g., the main PCB) on which a plurality of elements are mounted. The upper structure 461 may include a first ground panel 461a and a second ground panel 461b.

The first ground panel 461a may be disposed to face toward a central wire 411a of the micro-strip line 410. The first ground panel 461a may extend in a direction parallel to the central wire 411a.

The first ground panel 461a may be connected with the first sidewall 462 at one end thereof and may be connected with the second sidewall 463 at an opposite end thereof. The first ground panel 461a may be formed of a metallic material.

According to an embodiment, the first sidewall 462 and the second sidewall 463 may be parallel to each other. The first ground panel 461a may be perpendicular to the first sidewall 462 and the second sidewall 463.

The first ground panel 461a, the first sidewall 462, and the second sidewall 463 may surround the central wire 411a. The first ground panel 461a, the first sidewall 462, and the second sidewall 463 may separate the central wire 411a from surrounding components, thereby reducing a signal loss and reducing occurrence of parasitic resonance.

Figure 5:
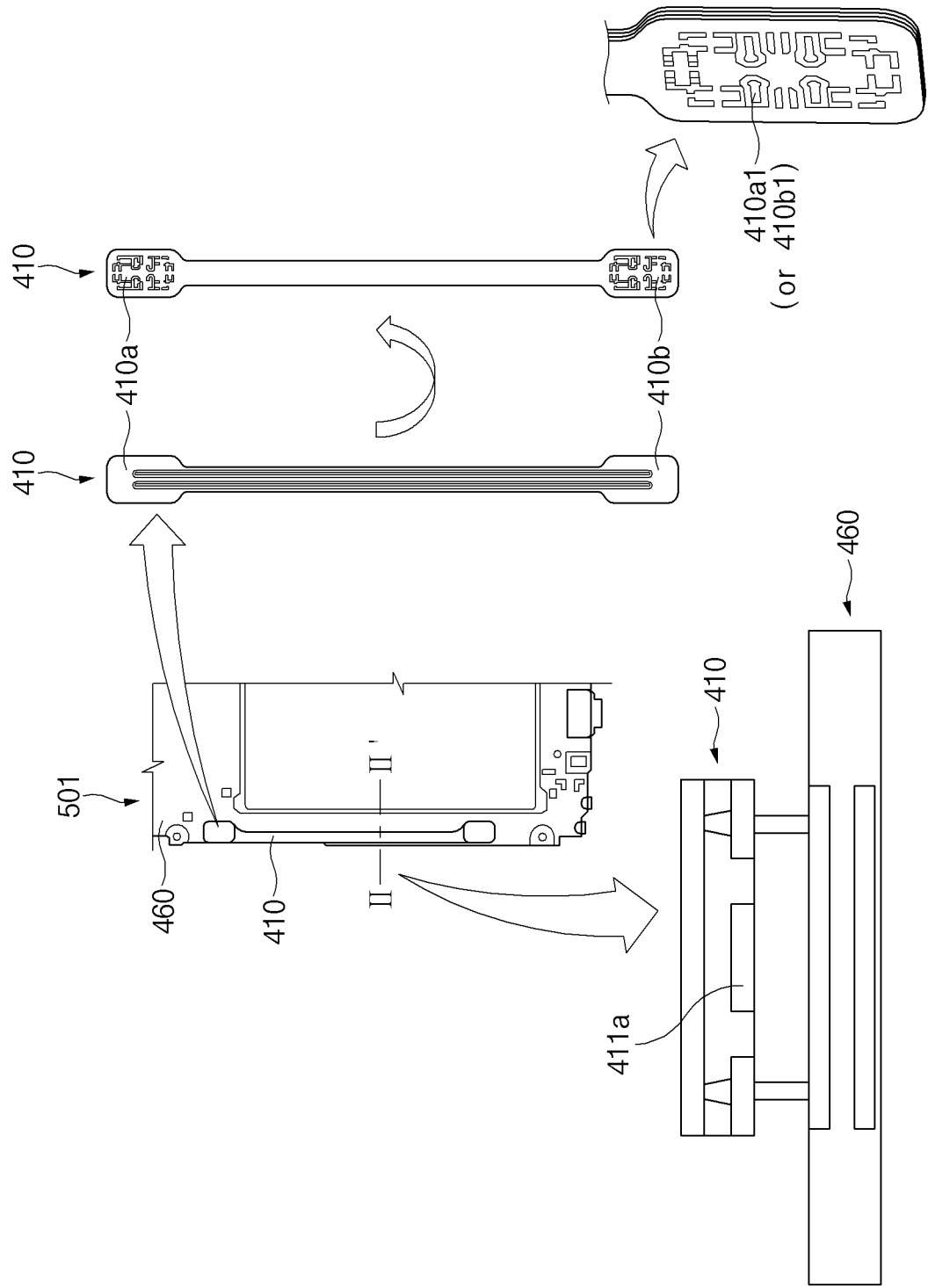
FIG. 5 is a view illustrating an application example in which part of a shielding structure is formed of a printed circuit board according to various embodiments.

FIG. 5 is a view illustrating an application example in which part of a shielding structure is formed of a printed circuit board according to various embodiments. FIG. 5 is illustrative, and the disclosure is not limited thereto.

Referring to FIG. 5, an electronic device 501 (e.g., the electronic device 101 of FIG. 1) may include a main circuit board 460 therein. Part of the main circuit board 460 may form a shielding structure surrounding a central wire 411a of a micro-strip line 410.

The micro-strip line 410 may connect a first point and a second point of the main circuit board 460. The micro-strip line 410 may extend parallel to the main circuit board 460.

The micro-strip line 410 may include a first connector 410a connected to the first point of the main circuit board 460 and a second connector 410b connected to the second point of the main circuit board 460.

Each of the first connector 410a and the second connector 410b may include at least one pad 410a1 or 410b1 on a surface thereof that is bonded to the main circuit board 460. The pad 410a1 and 410b1 may be connected to the central wire 411a in the interior of the micro-strip line 410.

Although FIG. 5 illustrates an example that the micro-strip line 410 connects the first point and the second point of the one circuit board, the disclosure is not limited thereto. For example, the micro-strip line 410 may connect a first point of a first circuit board and a second point of a second circuit board. In this case, part of a shielding structure may be formed as part of the first circuit board, and another part of the shielding structure may be formed as part of the second circuit board.

Figure 6:
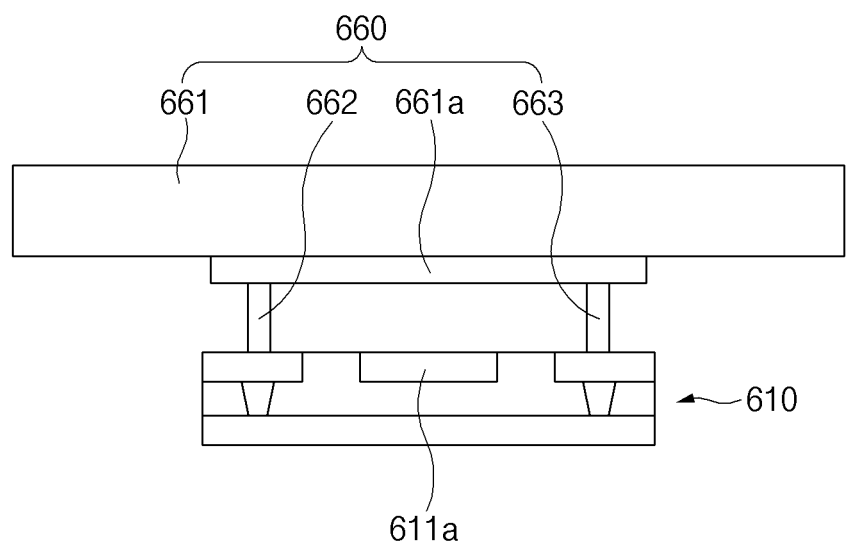
FIG. 6 illustrates a shielding structure using a mechanical part and a conductive pad according to various embodiments.

FIG. 6 illustrates a shielding structure using a mechanical part and a conductive pad according to various embodiments.

Referring to FIG. 6, a micro-strip line 610 may be surrounded by the shielding structure 660. The shielding structure 660 may be part of a structure (e.g., a bracket or a rear cover) of an electronic device that is disposed adjacent to the micro-strip line 610. The structure of the micro-strip line 610 may be the same as, or similar to, the structure of the micro-strip line 210 in FIG. 2.

The shielding structure 660 may include a structure 661, a conductive pad 661a, a first sidewall 662, and a second sidewall 663.

The conductive pad 661a may be attached to the structure 661. The conductive pad 661a may be a metal panel, electromagnetic interference (EMI) paint, or a conductive tape. The conductive pad 661a may be disposed to face toward a central wire 611a of the micro-strip line 610. The conductive pad 661a may extend in a direction parallel to the central wire 611a of the micro-strip line 610. The conductive pad 661a may be connected with the first sidewall 462 at one end thereof and may be connected with the second sidewall 463 at an opposite end thereof.

According to an embodiment, the first sidewall 662 and the second sidewall 663 may be parallel to each other. The conductive pad 661a may be perpendicular to the first sidewall 663 and the second sidewall 663.

The conductive pad 661a, the first sidewall 662, and the second sidewall 663 may surround the central wire 611a. The conductive pad 661a, the first sidewall 662, and the second sidewall 663 may separate the central wire 611a from surrounding components, thereby reducing a signal loss and reducing occurrence of parasitic resonance.

Figure 7:
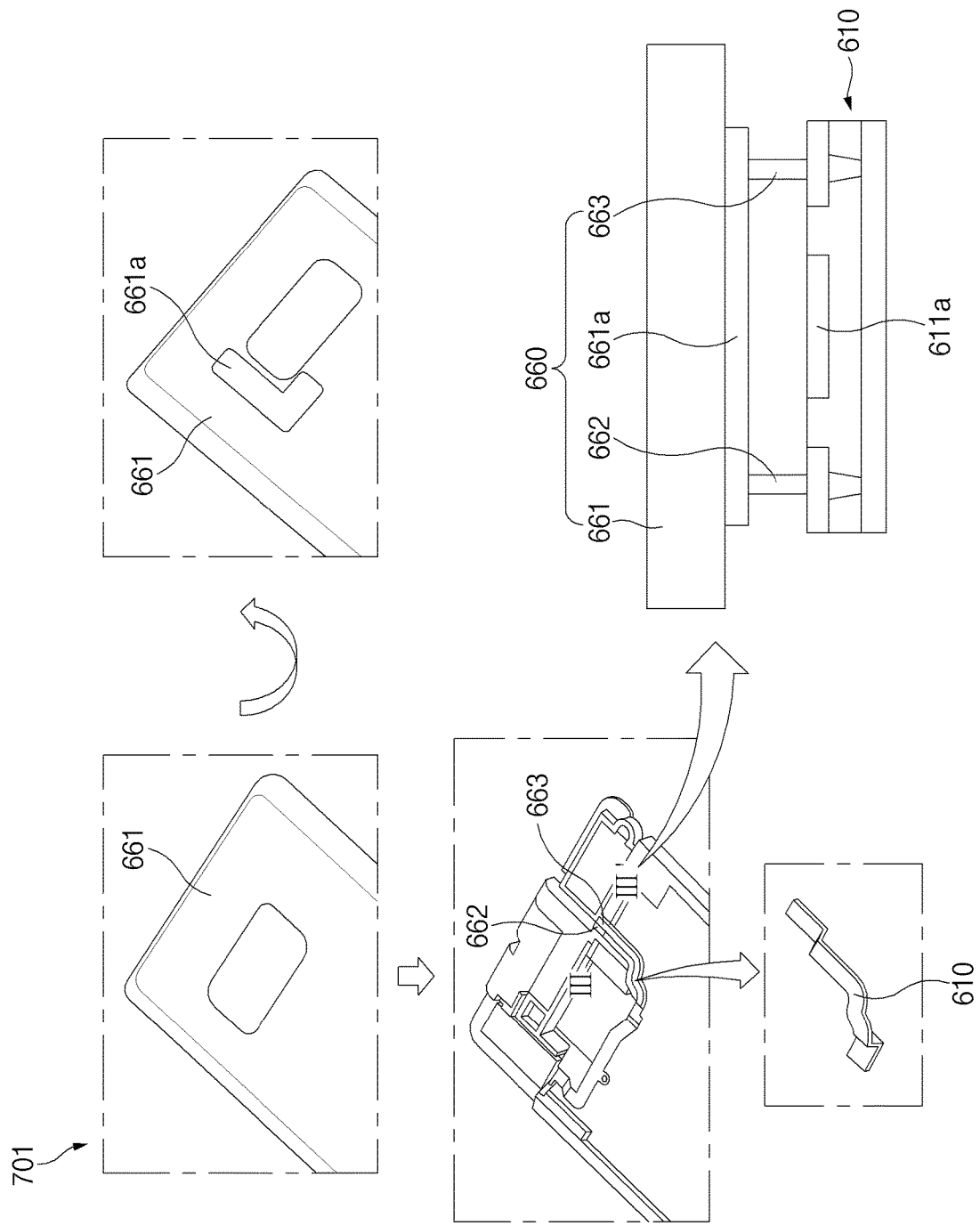
FIG. 7 is a view illustrating an application example of a shielding structure using a conductive pad according to various embodiments.

FIG. 7 is a view illustrating an application example of a shielding structure using a conductive pad according to various embodiments. FIG. 7 is illustrative, and the disclosure is not limited thereto.

Referring to FIG. 7, an electronic device 701 (e.g., the electronic device 101 of FIG. 1) may include a rear cover 661. A conductive pad 661a may be mounted on a rear surface (a surface facing toward the inside of the electronic device 701) of the rear cover 661. The conductive pad 661a may be a metal panel, EMI paint, or a conductive tape.

When the rear cover 661 is mounted on the electronic device 701, the conductive pad 661a may be adjacent to a micro-strip line 610 and may cover the entire area in which the micro-strip line 610 is disposed.

In a sectional view taken along line the conductive pad 661a, a first sidewall 662, and a second sidewall 663 may form a shielding structure surrounding a central wire 611a. According to an embodiment, the first sidewall 662 and the second sidewall 663 may be formed of polyurethane foam (PORON).

The micro-strip line 610 may connect a first point and a second point in the interior of the electronic device 701. For example, the first point may be an antenna that receives an RF signal from the outside. The second point may be an SMD point of a circuit board on which an RF module for processing the received RF signal is mounted.

Figure 8:
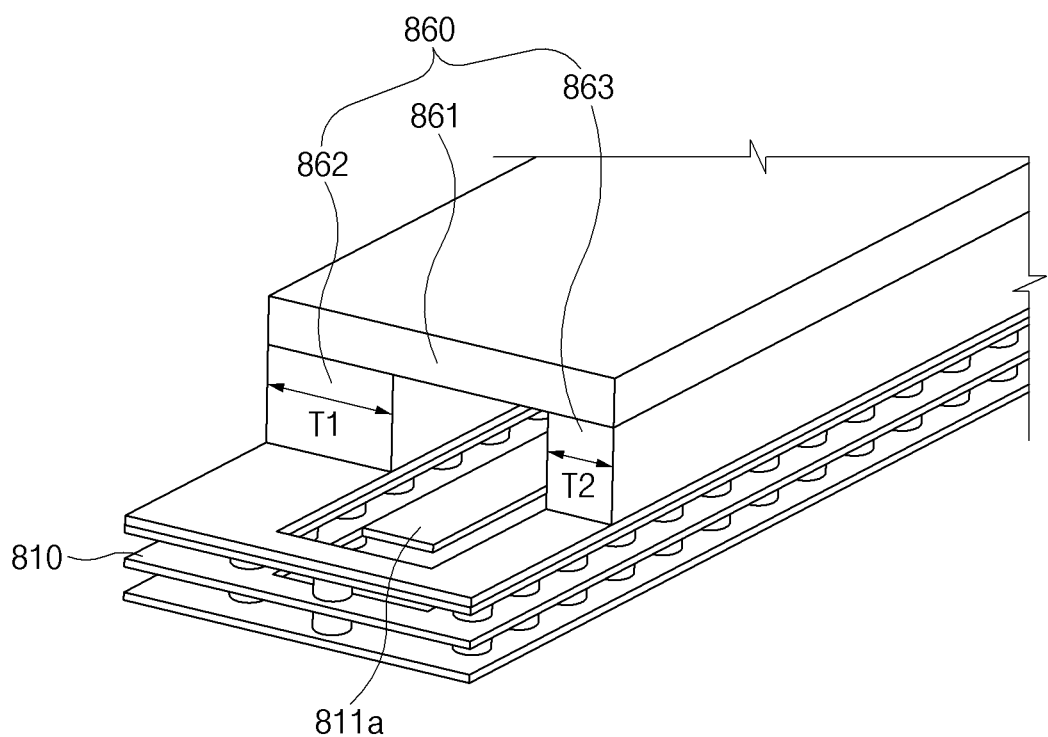
FIG. 8 illustrates a shielding structure in which a first sidewall and a second sidewall have different forms, according to various embodiments.

FIG. 8 illustrates a shielding structure in which a first sidewall and a second sidewall have different forms, according to various embodiments. FIG. 8 is illustrative, and the disclosure is not limited thereto.

Referring to FIG. 8, a micro-strip line 810 may be surrounded by the shielding structure 860. The structure of the micro-strip line 810 may be the same as, or similar to, the structure of the micro-strip line 210 in FIG. 2.

The shielding structure 860 may include an upper portion 861, the first sidewall 862, and the second sidewall 863. The upper portion 861 may be part of a shield can, part of a circuit board (e.g., a main PCB) disposed adjacent to the micro-strip line 810, or part of a structure (e.g., a bracket or a rear cover) of an electronic device.

According to an embodiment, the first sidewall 862 and the second sidewall 863 may have different thicknesses. For example, the first sidewall 862 may have a first thickness T1, and the second sidewall 863 may have a second thickness T2 smaller than the first thickness T1.

Figure 9:
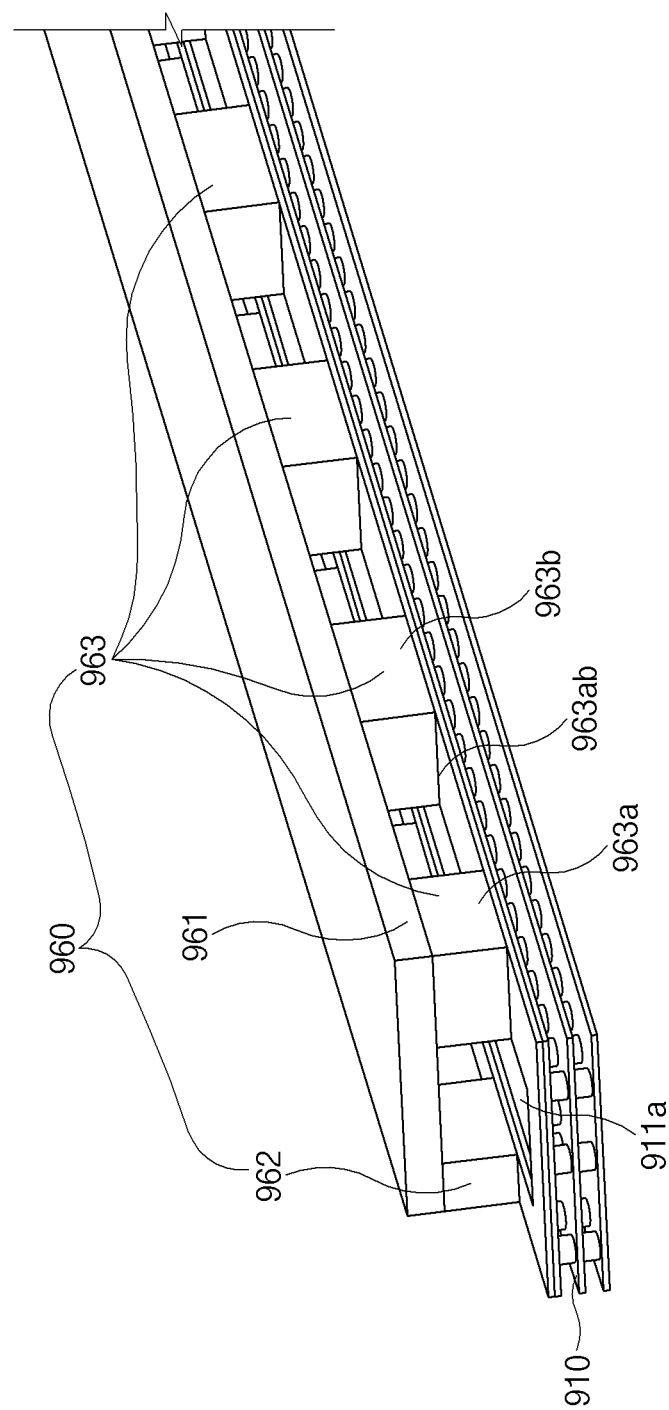
FIG. 9 illustrates a shielding structure in which a first sidewall and a second sidewall have a bridge structure, according to various embodiments.

FIG. 9 illustrates a shielding structure in which a first sidewall and a second sidewall have a bridge structure, according to various embodiments. FIG. 9 is illustrative, and the disclosure is not limited thereto.

Referring to FIG. 9, a micro-strip line 910 may be surrounded by the shielding structure 960. The structure of the micro-strip line 910 may be the same as, or similar to, the structure of the micro-strip line 210 in FIG. 2.

The shielding structure 960 may include an upper portion 961, the first sidewall 962, and the second sidewall 963. The upper portion 961 may be part of a shield can, part of a circuit board (e.g., a main PCB) disposed adjacent to the micro-strip line 910, or part of a structure (e.g., a bracket or a rear cover) of an electronic device.

According to an embodiment, each of the first sidewall 962 and the second sidewall 963 may be implemented with a plurality of bridges. The plurality of bridges may be disposed at specified intervals. For example, a first bridge 963a and a second bridge 963b of the second sidewall 963 may be disposed to maintain a specified interval 963ab. Electromagnetic waves moved through the interval 963ab between the first bridge 963a and the second bridge 963b may not greatly affect a signal transmitted through a central wire 911a. For example, the interval 963ab between the bridges may be about 4 mm or less.

Figure 10:
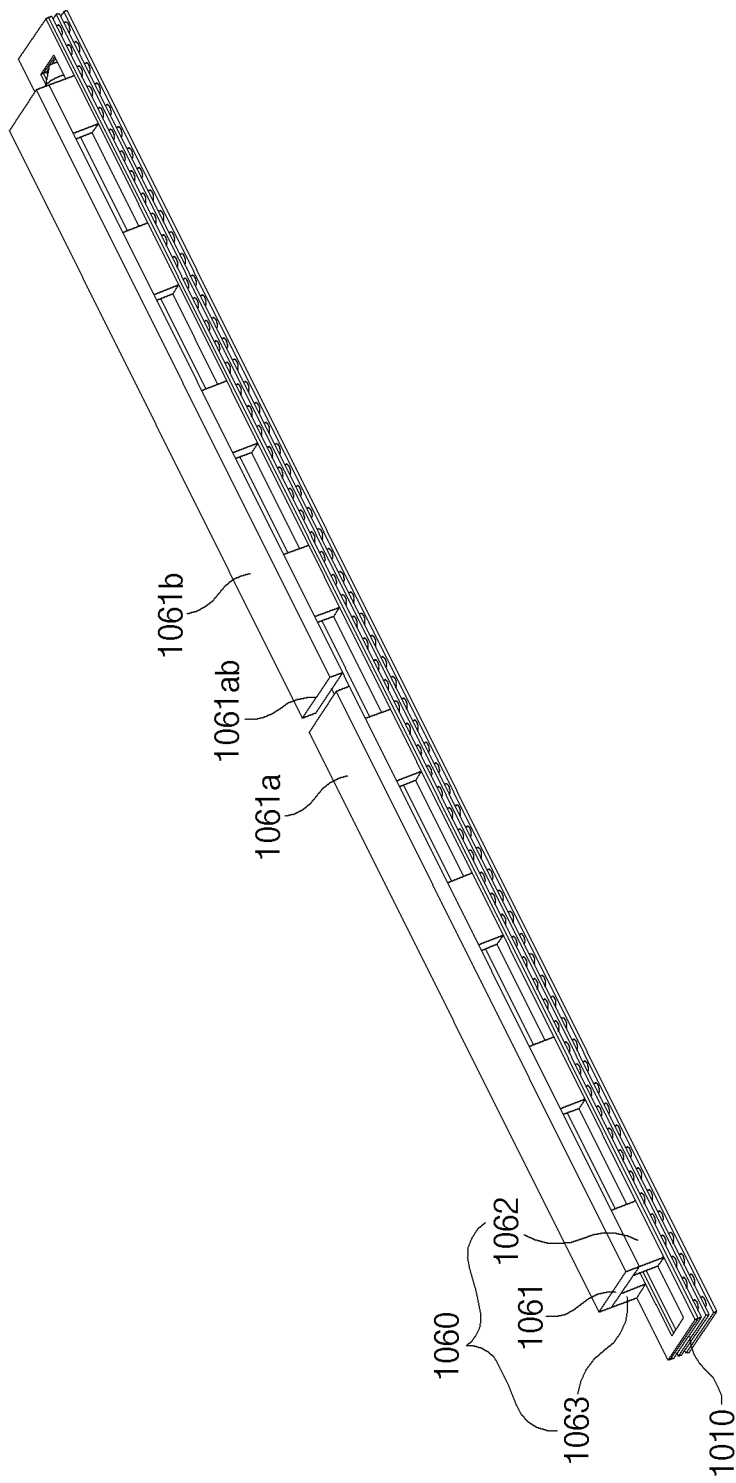
FIG. 10 illustrates a shielding structure including a slit according to various embodiments.

FIG. 10 illustrates a shielding structure including a slit according to various embodiments. Although FIG. 10 illustrates the shielding structure including one slit, the disclosure is not limited thereto. For example, an upper portion of the shielding structure may include a plurality of slits disposed at specified intervals.

Referring to FIG. 10, a micro-strip line 1010 may be surrounded by the shielding structure 1060. The structure of the micro-strip line 1010 may be the same as, or similar to, the structure of the micro-strip line 210 in FIG. 2.

The shielding structure 1060 may include the upper portion 1061, a first sidewall 1062, and a second sidewall 1063. The upper portion 1061 may be part of a shield can, part of a circuit board (e.g., a main PCB) disposed adjacent to the micro-strip line 1010, or part of a structure (e.g., a bracket or a rear cover) of an electronic device.

According to an embodiment, the upper portion 1061 may include the slit 1061ab. The upper portion 1061 may be divided into a first upper portion 1061a and a second upper portion 1061b by the slit 1061ab. The slit 1061ab may be disposed in an area where the micro-strip line 1010 is bent in a flexible form. To reduce a signal loss occurring in the micro-strip line 1010, the size of the slit 1061ab may be implemented to be minimized depending on a material condition and an arrangement condition.

Figure 11:
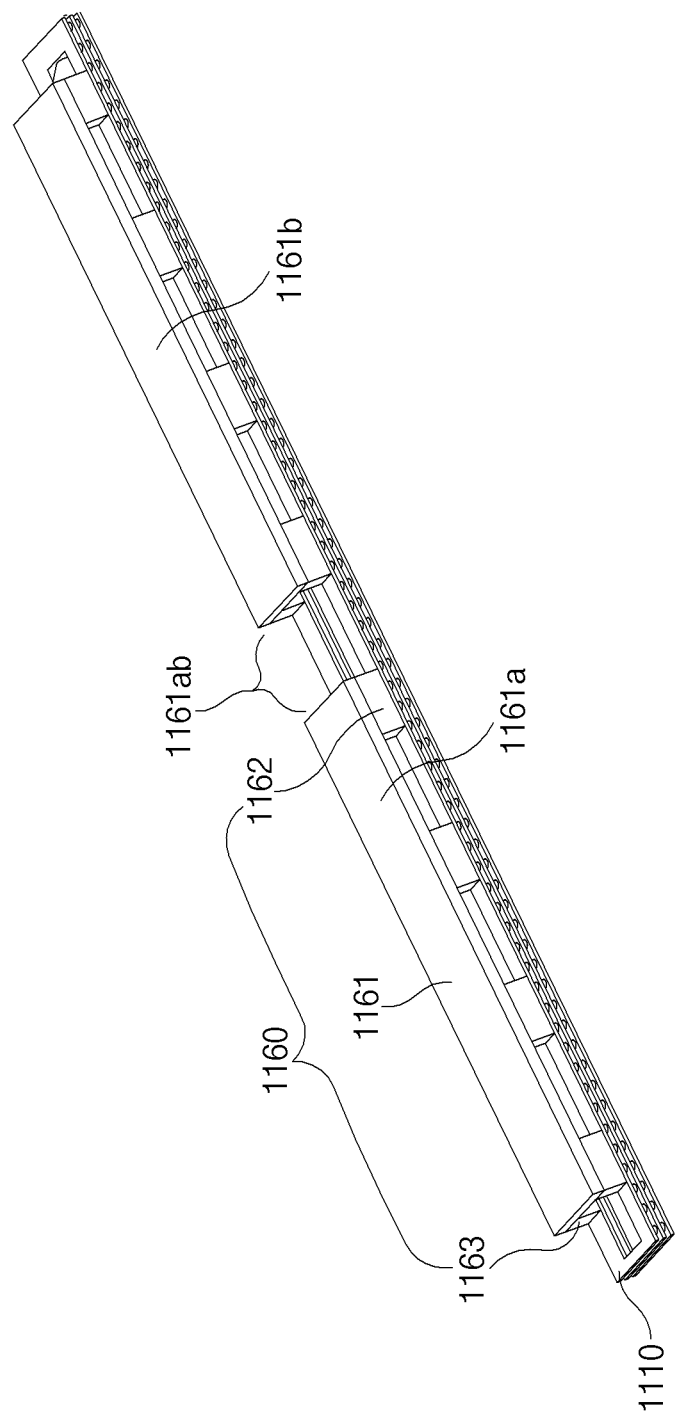
FIG. 11 illustrates a form in which an opening is included in an upper portion of a shielding structure according to various embodiments.

FIG. 11 illustrates a form in which an opening is included in an upper portion of a shielding structure according to various embodiments.

Referring to FIG. 11, a micro-strip line 1110 may be surrounded by the shielding structure 1160. The structure of the micro-strip line 1110 may be the same as, or similar to, the structure of the micro-strip line 210 in FIG. 2.

The shielding structure 1160 may include the upper portion 1161, a first sidewall 1162, and a second sidewall 1163. The upper portion 1161 may be part of a shield can, part of a circuit board (e.g., a main PCB) disposed adjacent to the micro-strip line 1110, or part of a structure (e.g., a bracket or a rear cover) of an electronic device.

According to an embodiment, the upper portion 1161 may include the opening 1161ab. The upper portion 1161 may be divided into a first upper portion 1161a and a second upper portion 1161b by the opening 1161ab. The opening 1161ab may be disposed in an area where the micro-strip line 1010 is bent in a flexible form. The opening 1161ab may have various sizes depending on an environment in which the micro-strip line 1110 is mounted.

According to an embodiment, when the first sidewall 1162 and the second sidewall 1163 are implemented in a bridge form, the opening 1161ab may be disposed to coincide with a space between bridges of the first sidewall 1162 and the second sidewall 1163.

Figure 12:
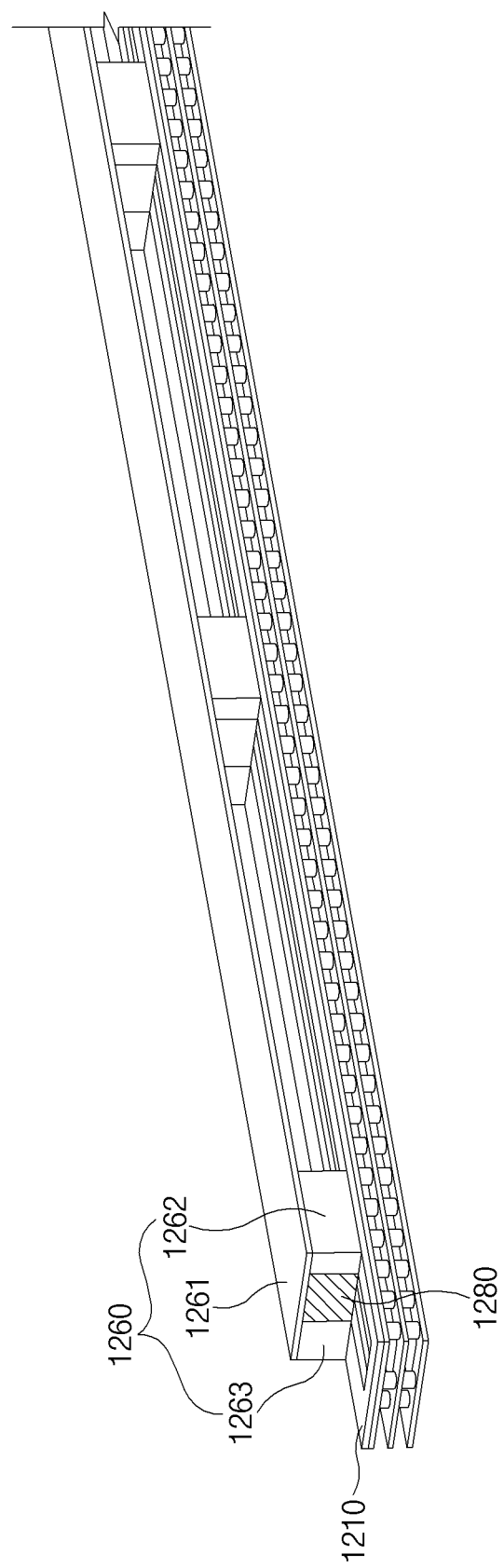
FIG. 12 illustrates a shielding structure including a support member between sidewalls according to various embodiments.

FIG. 12 illustrates a shielding structure including a support member between sidewalls according to various embodiments.

Referring to FIG. 12, a micro-strip line 1210 may be surrounded by the shielding structure 1260. The structure of the micro-strip line 1210 may be the same as, or similar to, the structure of the micro-strip line 210 in FIG. 2.

The shielding structure 1260 may include an upper portion 1261, a first sidewall 1262, and a second sidewall 1263. The upper portion 1261 may be part of a shield can, part of a circuit board (e.g., a main PCB) disposed adjacent to the micro-strip line 1210, or part of a structure (e.g., a bracket or a rear cover) of an electronic device.

According to an embodiment, the shielding structure 1260 may further include the support member 1280 between the first sidewall 1262 and the second sidewall 1263. The support member 1280 may support the upper portion 1261, the first sidewall 1262, and the second sidewall 1263 such that the upper portion 1261, the first sidewall 1262, and the second sidewall 1263 have a specified form. In an embodiment, when the first sidewall 1262 and the second sidewall 1263 have a bridge structure, the support member 1280 may be added.

According to an embodiment, the support member 1280 may be implemented with non-conductive PORON or a plastic-based material.

Figure 13:
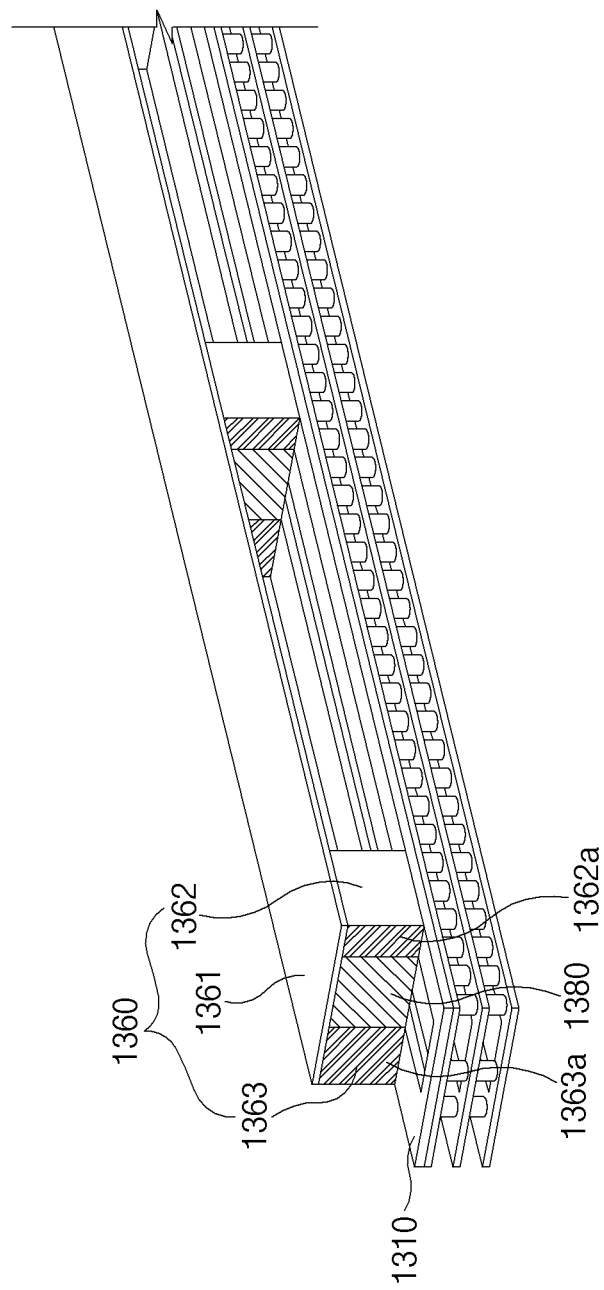
FIG. 13 illustrates a shielding structure having a sidewall including a support member according to various embodiments.

FIG. 13 illustrates a shielding structure having a sidewall including a support member according to various embodiments.

Referring to FIG. 13, a micro-strip line 1310 may be surrounded by the shielding structure 1360. The structure of the micro-strip line 1310 may be the same as, or similar to, the structure of the micro-strip line 210 in FIG. 2.

The shielding structure 1360 may include an upper portion 1361, a first sidewall 1362, and a second sidewall 1363. The upper portion 1361 may be part of a shield can, part of a circuit board (e.g., a main PCB) disposed adjacent to the micro-strip line 1310, or part of a structure (e.g., a bracket or a rear cover) of an electronic device.

According to an embodiment, the first sidewall 1362 of the shielding structure 1360 may make contact with a first side insulating wall 1362a formed of a non-conductive material. For example, the first sidewall 1362 may be implemented with a metallic material, and an inner surface (a surface facing toward the second sidewall 1363) of the first sidewall 1362 may make contact with the first side insulating wall 1362a formed of non-conductive PORON or a plastic-based material. The second sidewall 1363 of the shielding structure 1360 may make contact with a second side insulating wall 1363a formed of a non-conductive material. For example, the second sidewall 1363 may be implemented with a metallic material, and an inner surface (a surface facing toward the first sidewall 1362) of the second sidewall 1363 may make contact with the second side insulating wall 1363a formed of non-conductive PORON or a plastic-based material.

According to an embodiment, the shielding structure 1260 may further include a support member 1380 between the first side insulating wall 1362a and the second side insulating wall 1363a. The support member 1380 may support the upper portion 1261, the first side insulating wall 1362a, and the second side insulating wall 1363a such that the upper portion 1261, the first side insulating wall 1362a, and the second side insulating wall 1363a have a specified form. The support member 1380 may be implemented with non-conductive PORON or a plastic-based material.

Figure 14:
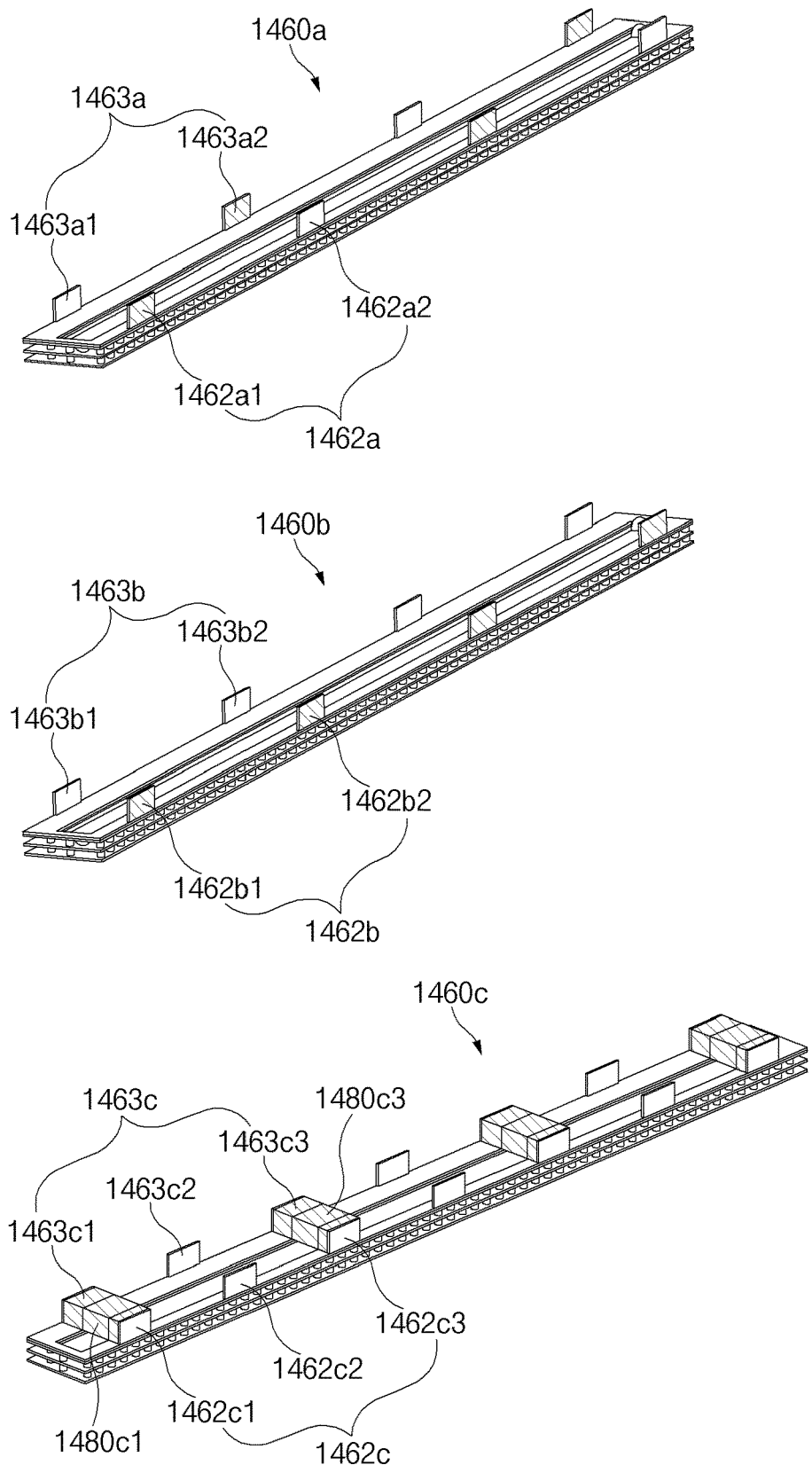
FIG. 14 illustrates shielding structures having a sidewall with a bridge structure according to various embodiments.

FIG. 14 illustrates shielding structures having a sidewall with a bridge structure according to various embodiments. FIG. 14 is illustrative, and the disclosure is not limited thereto. For convenience of description, upper portions of the shielding structures are not illustrated.

Referring to FIG. 14, a shielding structure 1460a may include a first sidewall 1462a and a second sidewall 1463a. Each of the first sidewall 1462a and the second sidewall 1463a may be implemented with a plurality of bridges. The plurality of bridges may be disposed at specified intervals. The bridges constituting the first sidewall 1462a and the second sidewall 1463a may be formed by alternating conductive materials with non-conductive materials.

For example, a first bridge 1462a1 of the first sidewall 1462a may be formed of a non-conductive material (e.g., PORON). A second bridge 1462a2 of the first sidewall 1462a may be formed of a conductive material (e.g., metal). Similarly, a first bridge 1463a1 of the second sidewall 1463a may be formed of a non-conductive material (e.g., PORON). A second bridge 1463a2 of the first sidewall 1463a may be formed of a conductive material (e.g., metal).

A shielding structure 1460b may include a first sidewall 1462b and a second sidewall 1463b. Each of the first sidewall 1462b and the second sidewall 1463b may be implemented with a plurality of bridges. The plurality of bridges may be disposed at specified intervals. The bridges constituting the first sidewall 1462b may be implemented with a non-conductive material. The bridges constituting the second sidewall 1463b may be implemented with a conductive material.

For example, a first bridge 1462b1 and a second bridge 1462b2 of the first sidewall 1462b may all be formed of a non-conductive material (e.g., PORON). A first bridge 1463b1 and a second bridge 1463b2 of the second sidewall 1463b may all be formed of a conductive material (e.g., metal).

A shielding structure 1460c may include a first sidewall 1462c and a second sidewall 1463c. Each of the first sidewall 1462c and the second sidewall 1463c may be implemented with a plurality of bridges. The plurality of bridges may be disposed at specified intervals. At least part of a space between the bridges constituting the first sidewall 1462c and the bridges constituting the second sidewall 1463c may be filled with a support member, and another part of the space may not be filled with a separate support member.

For example, a space between a first bridge 1462c1 of the first sidewall 1462c and a first bridge 1463c1 of the second sidewall 1463c may be filled with a support member 1480c1. A space between a second bridge 1462c2 of the first sidewall 1462c and a second bridge 1463c2 of the second sidewall 1463c may not be filled with a separate support member. A space between a third bridge 1462c3 of the first sidewall 1462c and a third bridge 1463c3 of the second sidewall 1463c may be filled with a support member 1480c3.

Figure 15:
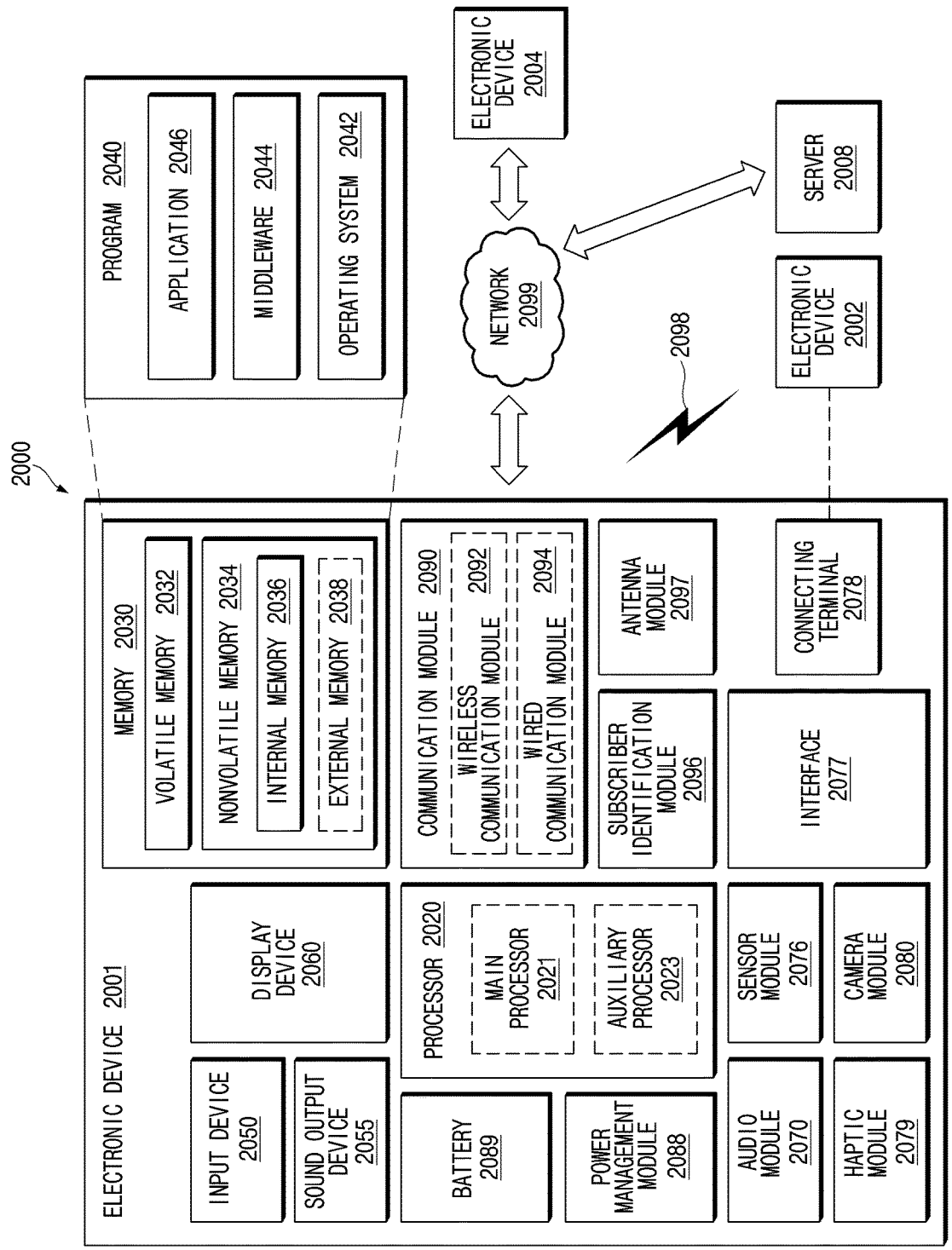
FIG. 15 is a block diagram of an electronic device in a network environment according to various embodiments.

FIG. 15 is a block diagram of an electronic device 2001 in a network environment 2000 according to various embodiments.

Referring to FIG. 15, under the network environment 2000, the electronic device 2001 (e.g., the electronic device 101) may communicate with an electronic device 2002 via a first network 2098 (e.g., a short-range wireless communication network), or an electronic device 2004 or a server 2008 via a second network 2099 (e.g., a long-range wireless communication network). According to an embodiment, the electronic device 2001 may communicate with the electronic device 2004 via the server 2008. According to an embodiment, the electronic device 2001 may include a processor 2020, memory 2030, an input device 2050, a sound output device 2055, a display device 2060, an audio module 2070, a sensor module 2076, an interface 2077, a haptic module 2079, a camera module 2080, a power management module 2088, a battery 2089, a communication module 2090, a subscriber identification module (SIM) 2096, or an antenna module 2097. In some embodiments, at least one (e.g., the display device 2060 or the camera module 2080) of the components may be omitted from the electronic device 2001, or one or more other components may be added in the electronic device 2001. In some embodiments, some of the components may be implemented as single integrated circuitry. For example, the sensor module 2076 (e.g., a fingerprint sensor, an iris sensor, or an illuminance sensor) may be implemented as embedded in the display device 2060 (e.g., a display).

The processor 2020 may execute, for example, software (e.g., a program 2040) to control at least one other component (e.g., a hardware or software component) of the electronic device 2001 coupled with the processor 2020, and may perform various data processing or computation. According to one embodiment, as at least part of the data processing or computation, the processor 2020 may load a command or data received from another component (e.g., the sensor module 2076 or the communication module 2090) in volatile memory 2032, process the command or the data stored in the volatile memory 2032, and store resulting data in non-volatile memory 2034. According to an embodiment, the processor 2020 may include a main processor 2021 (e.g., a central processing unit (CPU) or an application processor (AP)), and an auxiliary processor 2023 (e.g., a graphics processing unit (GPU), an image signal processor (ISP), a sensor hub processor, or a communication processor (CP)) that is operable independently from, or in conjunction with, the main processor 2021. Additionally or alternatively, the auxiliary processor 2023 may be adapted to consume less power than the main processor 2021, or to be specific to a specified function. The auxiliary processor 2023 may be implemented as separate from, or as part of the main processor 2021.

The auxiliary processor 2023 may control at least some of functions or states related to at least one component (e.g., the display device 2060, the sensor module 2076, or the communication module 2090) among the components of the electronic device 2001, instead of the main processor 2021 while the main processor 2021 is in an inactive (e.g., sleep) state, or together with the main processor 2021 while the main processor 2021 is in an active state (e.g., executing an application). According to an embodiment, the auxiliary processor 2023 (e.g., an image signal processor or a communication processor) may be implemented as part of another component (e.g., the camera module 2080 or the communication module 2090) functionally related to the auxiliary processor 2023. The memory 2030 may store various data used by at least one component (e.g., the processor 2020 or the sensor module 2076) of the electronic device 2001. The various data may include, for example, software (e.g., the program 2040) and input data or output data for a command related thereto. The memory 2030 may include the volatile memory 2032 or the non-volatile memory 2034.

The program 2040 may be stored in the memory 2030 as software, and may include, for example, an operating system (OS) 2042, middleware 2044, or an application 2046.

The input device 2050 may receive a command or data to be used by other component (e.g., the processor 2020) of the electronic device 2001, from the outside (e.g., a user) of the electronic device 2001. The input device 2050 may include, for example, a microphone, a mouse, a keyboard, or a digital pen (e.g., a stylus pen).

The sound output device 2055 may output sound signals to the outside of the electronic device 2001. The sound output device 2055 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 2060 may visually provide information to the outside (e.g., a user) of the electronic device 2001. The display device 2060 may include, for example, a display, a hologram device, or a projector and control circuitry to control a corresponding one of the display, hologram device, and projector. According to an embodiment, the display device 2060 may include touch circuitry adapted to detect a touch, or sensor circuitry (e.g., a pressure sensor) adapted to measure the intensity of force incurred by the touch.

The audio module 2070 may convert a sound into an electrical signal and vice versa. According to an embodiment, the audio module 2070 may obtain the sound via the input device 2050, or output the sound via the sound output device 2055 or a headphone of an external electronic device (e.g., an electronic device 2002) directly (e.g., wiredly) or wirelessly coupled with the electronic device 2001.

The sensor module 2076 may detect an operational state (e.g., power or temperature) of the electronic device 2001 or an environmental state (e.g., a state of a user) external to the electronic device 2001, and then generate an electrical signal or data value corresponding to the detected state. According to an embodiment, the sensor module 2076 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 2077 may support one or more specified protocols to be used for the electronic device 2001 to be coupled with the external electronic device (e.g., the electronic device 2002) directly (e.g., wiredly) or wirelessly. According to an embodiment, the interface 2077 may include, for example, a high definition multimedia interface (HDMI), a universal serial bus (USB) interface, a secure digital (SD) card interface, or an audio interface.

A connecting terminal 2078 may include a connector via which the electronic device 2001 may be physically connected with the external electronic device (e.g., the electronic device 2002). According to an embodiment, the connecting terminal 2078 may include, for example, a HDMI connector, a USB connector, a SD card connector, or an audio connector (e.g., a headphone connector).

The haptic module 2079 may convert an electrical signal into a mechanical stimulus (e.g., a vibration or a movement) or electrical stimulus which may be recognized by a user via his tactile sensation or kinesthetic sensation. According to an embodiment, the haptic module 2079 may include, for example, a motor, a piezoelectric element, or an electric stimulator.

The camera module 2080 may capture a still image or moving images. According to an embodiment, the camera module 2080 may include one or more lenses, image sensors, image signal processors, or flashes.

The power management module 2088 may manage power supplied to the electronic device 2001. According to one embodiment, the power management module 2088 may be implemented as at least part of, for example, a power management integrated circuit (PMIC).

The battery 2089 may supply power to at least one component of the electronic device 2001. According to an embodiment, the battery 2089 may include, for example, a primary cell which is not rechargeable, a secondary cell which is rechargeable, or a fuel cell.

The communication module 2090 may support establishing a direct (e.g., wired) communication channel or a wireless communication channel between the electronic device 2001 and the external electronic device (e.g., the electronic device 2002, the electronic device 2004, or the server 2008) and performing communication via the established communication channel. The communication module 2090 may include one or more communication processors that are operable independently from the processor 2020 (e.g., the application processor (AP)) and supports a direct (e.g., wired) communication or a wireless communication. According to an embodiment, the communication module 2090 may include a wireless communication module 2092 (e.g., a cellular communication module, a short-range wireless communication module, or a global navigation satellite system (GNSS) communication module) or a wired communication module 2094 (e.g., a local area network (LAN) communication module or a power line communication (PLC) module). A corresponding one of these communication modules may communicate with the external electronic device via the first network 2098 (e.g., a short-range communication network, such as Bluetooth™, wireless-fidelity (Wi-Fi) direct, or infrared data association (IrDA)) or the second network 2099 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other.

According to an embodiment, a wireless communication module 2092 may identify and authenticate an electronic device 2001 in a communication network using user information stored in a subscriber identification module 2096.

An antenna module 2097 may include one or more antennas for transmitting or receiving a signal or power to or from the outside. According to an embodiment, a communication module 2090 (e.g., the wireless communication module 2092) may transmit or receive a signal to or from an external electronic device through an antenna appropriate for a communication scheme.

According to various embodiments, an electronic device may include a circuit board and a conductive member. The circuit board may include a first layer including a first wire, a second wire formed on one side of the first wire along the first wire, and a third wire formed on an opposite side of the first wire along the first wire, a second layer that is formed along the first wire, the second wire, and the third wire and that includes a ground plane electrically connected with the second wire and the third wire, and an insulating layer that is disposed between the first layer and the second layer and that has a first permittivity. The conductive member may be disposed on the first layer so as to have, along the first wire, a separation space that is able to be filled with a dielectric having a second permittivity lower than the first permittivity, the conductive member being electrically connected with a ground of the electronic device.

According to various embodiments, the conductive member may be electrically connected with the second wire or the third wire. The conductive member may include a first conductive member disposed along the second wire, a second conductive member disposed along the third wire, and a third conductive member electrically connected with the first conductive member and the second conductive member. The first conductive member and the second conductive member may be substantially parallel to each other and may be substantially perpendicular to the circuit board. The first conductive member and the second conductive member may have different thicknesses.

According to various embodiments, the conductive member may include a plurality of bridges disposed side by side at specified intervals. A plurality of other bridges having non-conductivity may alternate with the plurality of bridges. Among the plurality of bridges, bridges disposed along the second wire may have non-conductivity, and bridges disposed along the third wire may have conductivity. The plurality of bridges may include non-conductive bridges and conductive bridges alternating with one another along the second wire or the third wire.

According to various embodiments, the third conductive member may include a slit facing in a direction perpendicular to a direction in which the first wire extends. According to various embodiments, the third conductive member may be integrally formed with a shield can that covers other elements mounted on the circuit board.

According to various embodiments, the electronic device may further include another circuit board including another ground plane. The circuit board may be disposed to face the other circuit board, and the separation space may be formed by the conductive member and the other ground plane.

According to various embodiments, the electronic device may further include a bracket including a conductive area in at least part thereof. The circuit board may be disposed to face the bracket, and the separation space may be formed by the conductive member and the conductive area of the bracket.

An electronic device according to various embodiments may include a micro-strip line including a first wire, a second wire formed on one side of the first wire along the first wire, and a third wire formed on an opposite side of the first wire along the first wire and a shielding structure including a conductive member that surrounds the first wire on a surface of the micro-strip line. The electronic device may include a circuit board on which the micro-strip line is mounted, and the conductive member may be integrally formed with a shield can that covers other elements mounted on the circuit board.

According to various embodiments, the electronic device may further include an antenna that receives a signal in a specified frequency band and communication circuitry that processes the signal received by the antenna and that is mounted on the circuit board. The micro-strip line may electrically connect the antenna and the communication circuitry, and the first wire may transmit the signal in the specified frequency band to the communication circuitry.

According to various embodiments, the electronic device may further include a first circuit board on which the micro-strip line is mounted and a second circuit board different from the first circuit board, and the conductive member may form a ground panel formed on a surface of the second circuit board.

According to various embodiments, the electronic device may further include a bracket that is disposed adjacent to the micro-strip line and that includes a conductive area in at least part thereof, and the conductive member may be electrically connected with the conductive area and may surround the first wire. According to various embodiments, the conductive area may be formed of one of a metal panel, EMI paint, or a conductive tape.

An electronic device according to various embodiments may include a flexible circuit board and a conductive member. The flexible circuit board may include a first layer including a first wire, a second wire formed on one side of the first wire along the first wire, and a third wire formed on an opposite side of the first wire along the first wire, a second layer that is formed along the first wire, the second wire, and the third wire and that includes a ground plane electrically connected with the second wire and the third wire, and an insulating layer that is disposed between the first layer and the second layer and that has a first permittivity. The conductive member may be disposed on the first layer so as to have, along the first wire, a separation space that is able to be filled with a dielectric having a second permittivity lower than the first permittivity, the conductive member being electrically connected with a ground of the electronic device.

At least some of the above-described components may be coupled mutually and communicate signals (e.g., commands or data) there between via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 2001 and the external electronic device 2004 via the server 2008 coupled with the second network 2099. Each of the electronic devices 2002 and 2004 may be a device of a same type as, or a different type, from the electronic device 2001. According to an embodiment, all or some of operations to be executed at the electronic device 2001 may be executed at one or more of the external electronic devices 2002, 2004, or 2008. For example, if the electronic device 2001 should perform a function or a service automatically, or in response to a request from a user or another device, the electronic device 2001, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 2001. The electronic device 2001 may provide the outcome, with or without further processing of the outcome, as at least part of a reply to the request. To that end, a cloud computing, distributed computing, or client-server computing technology may be used, for example.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device comprising:
    a first main printed circuit board (PCB);
    a second main PCB;
    a circuit board; and
    a shielding structure,
    wherein the circuit board includes:
        a first layer including a first wire, a second wire formed on one side of the first wire along the first wire, and a third wire formed on an opposite side of the first wire along the first wire;
        a second layer formed along the first wire, the second wire, and the third wire, the second layer including a ground plane electrically connected with the second wire and the third wire; and
        an insulating layer disposed between the first layer and the second layer, the insulating layer having a first permittivity, and
    wherein the shielding structure is disposed on the first layer so as to have, along the first wire, a separation space fillable with a dielectric having a second permittivity lower than the first permittivity, the shielding structure being electrically connected with a ground of the electronic device,
    wherein the shielding structure includes a first upper portion, a second upper portion, a first sidewall, a second sidewall, a third sidewall, and a fourth sidewall,
    wherein the first upper portion is a ground panel included in the first main PCB,
    wherein the first sidewall is disposed on the second wire and perpendicular to the first upper portion,
    wherein the second sidewall is disposed on the third wire and perpendicular to the first upper portion,
    wherein the second upper portion is a ground panel included in the second main PCB,
    wherein the third sidewall is disposed on the second wire and perpendicular to the second upper portion, and
    wherein the fourth sidewall is disposed on the third wire and perpendicular to the second upper portion.

2. The electronic device of claim 1, wherein the first sidewall and the second sidewall are parallel to each other and are perpendicular to the circuit board.

3. The electronic device of claim 1, wherein the first sidewall and the second sidewall have different thicknesses.

4. The electronic device of claim 1, wherein the shielding structure includes a plurality of bridges disposed side by side at specified intervals.

5. The electronic device of claim 4, wherein a plurality of other bridges having non-conductivity alternate with the plurality of bridges.

6. The electronic device of claim 4, wherein among the plurality of bridges, bridges disposed along the second wire have non-conductivity, and bridges disposed along the third wire have conductivity.

7. The electronic device of claim 4, wherein the plurality of bridges include non-conductive bridges and conductive bridges alternating with one another along the second wire or the third wire.

8. The electronic device of claim 1, wherein the first upper portion includes a slit facing in a direction perpendicular to a direction in which the first wire extends.

9. The electronic device of claim 1, wherein the first upper portion is integrally formed with a shield can configured to cover other elements mounted on the circuit board.

10. The electronic device of claim 1, further comprising:
a bracket including a conductive area in at least part thereof,
wherein the circuit board is disposed to face the bracket, and the separation space is formed by the shielding structure and the conductive area of the bracket.

* * * * *